United States Patent [19]

Yamaguchi et al.

[11] Patent Number: 4,819,213
[45] Date of Patent: Apr. 4, 1989

[54] SEMICONDUCTOR MEMORY

[75] Inventors: Yasunori Yamaguchi, Tachikawa; Masamichi Ishihara, Hinode, both of Japan

[73] Assignee: Hitachi, Ltd., Tokyo, Japan

[21] Appl. No.: 940,292

[22] Filed: Dec. 11, 1986

[30] Foreign Application Priority Data

Dec. 18, 1985 [JP] Japan ................ 60-282879

[51] Int. Cl.⁴ .................................. G11C 8/00
[52] U.S. Cl. .......................... 365/233; 365/220; 365/219
[58] Field of Search ............ 365/189, 194, 195, 230, 365/233, 239, 240, 220, 221, 219

[56] References Cited

U.S. PATENT DOCUMENTS 4,330,852  5/1982  Redwine et al. ............ 365/221
4,663,735  5/1987  Novak et al. ............... 365/233 X Primary Examiner—Joseph A. Popek
Attorney, Agent, or Firm—Fay, Sharpe, Beall, Fagan, Minnich & McKee

[57] ABSTRACT

A semiconductor memory for serially reading data of memory cells connected to the selected one word line based on the clock signal which defines a picture element and for writing the write data serially input to the latch circuit based on such clock signal to the memory cells, during the horizontal blanking time of a CRT monitor.

28 Claims, 5 Drawing Sheets

SEMICONDUCTOR MEMORY

BACKGROUND OF THE INVENTION

The present invention relates to a semiconductor memory device and particularly to a technique which is effective when employed, for example, to a semiconductor memory device for digital-converted picture signals for a digital television receiver, etc.

RAM is implemented for image processing for displaying characters and figures on the screen of a CRT (cathode ray tube). A serial access memory is described, for example, on pages 219 to 229 of "NIKKEI ELECTRONICS", issued on Feb. 11, 1985 by Nikkei-Mcgrowhill Corp. This RAM forms a signal for selecting word lines of a memory array by operating in conjunction with a counter circuit which generates an address signal. Suitable control signals and timing signals are supplied from external terminals. Moreover, the data lines of the memory array are connected in parallel to a data register through a switch circuit and data is thereby sent and received serially between such data register and external terminal. Transmission and reception of data to/from external terminal can thereby be conducted serially.

SUMMARY OF THE INVENTION

It has been found that a function for simultaneous input and output of serial data is very effective in an image memory such as that used for television receivers, video tape recorders, and the like.

It is therefore an object of the present invention to provide a semiconductor memory which effectively realizes serial input and output with simplified structure.

It is another object of the present invention to provide a semiconductor memory which realizes serial input and output of data.

Further objects and novel characteristics of the present invention will become apparent from description of the specification and drawings attached thereto.

The invention disclosed in this specification is briefly summarized hereunder.

A serial read of data is based on a clock signal which specifies a picture element. Data is input in serial to a latch circuit based on this clock signal. The data input are written to a memory cell from the latch circuit within the horizontal blanking time of a CRT or the like.

BRIEF DESCRIPTION OF THE INVENTION

DESCRIPTION OF THE PREFERRED EMBODIMENTS

Figure 1:
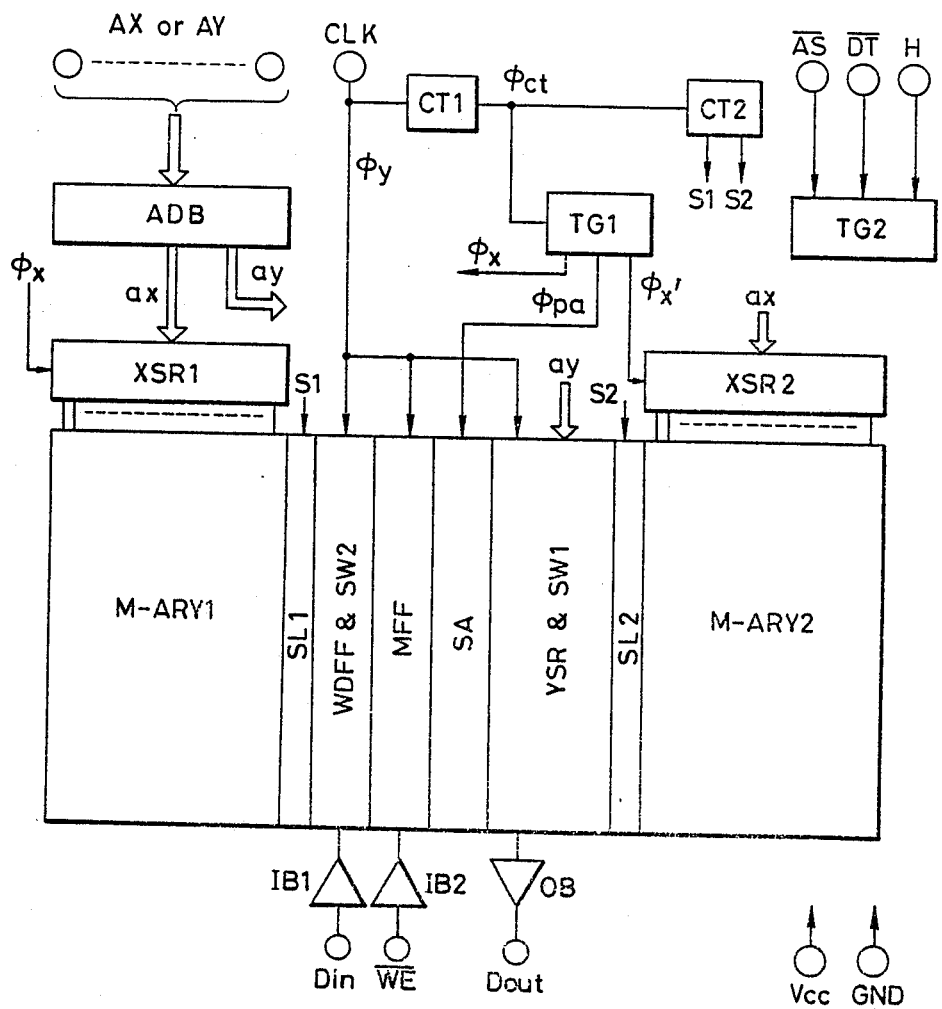
FIG. 1 is a block diagram illustrating a semiconductor memory as an embodiment of the present invention.

FIG. 1 is block diagram of an embodiment of a semiconductor memory to which the present invention is applied. Each circuit block may be formed on a semiconductor substrate (chip) of a single silicon crystal. It will be appreciated that other semiconductor integrated circuit manufacturing technology may also be used.

FIG. 1 shows memory arrays M-ARY1 and M-ARY2. Each circuit block shown is arranged between these arrays and shift registers XSR1 and XSR2, on a single chip.

A picture element ("pixel") is stored in memory as a string of 4 bits (red, blue, green, brightness). A plurality of picture elements are used to form a color picture. The semiconductor memory is accordingly provided with four circuits of FIG. 1 which are placed on a single chip. Alternatively, a sufficient quantity of semiconductor memories as may be required for a preselected number of bits of information corresponding to one picture element are implemented.

Although not limited, this embodiment uses a pair of memory arrays M-ARY1 and M-ARY2. The memory array M-ARY1 stores, for example, a picture element signal corresponding to the odd fields in an interlaced raster scan, and the memory array M-ARY2 stores a picture element signal corresponding to the even fields. A number of picture elements for storing a frame in the NTSC system is for example $757 \times 245$.

In the memory arrays M-ARY1 and M-ARY2, 250 word lines, which correspond to one horizontal scan line, are alternately provided. Moreover, 760 data lines (complementary data lines) are provided to store the data corresponding to one horizontal scan line. Therefore, the picture elements of 760 (horizontal) $\times$ 500 (vertical) in total form a sheet of picture. A high precision color picture may therefore be formed by repeatedly displaying the same picture signal by the interlaced scanning.

The memory arrays M-ARY1 and M-ARY2 include a dynamic (MOSFET type) memory cell comprised of MOSFETs (insulated gate type field effect transistors) for address selection, and a capacitor for storing information. The memory cells are arranged in the form of matrix. A MOSFET for address selection is coupled with a corresponding word line at its gate and is coupled with a data line at the drain. The word lines and data lines are formed by the well known "folded bit line" system. Namely, the drain of the MOSFET for address selection of said memory cell is coupled with the one corresponding data line among the complementary data lines, arranged in parallel as a pair. Moreover, although not illustrated, said complementary data lines are provided with a precharge circuit and an active restore circuit, respectively. This circuit is respectively included to the memory arrays M-ARY1 and M-ARY2. Since the structure of this memory array is similar to that of a well known dynamic type RAM, detailed explanation for the structure is omitted here.

Although not limited particularly, the data lines of the two memory arrays M-ARY1 and M-ARY2 are selectively connected to the input/output nodes of a sense amplifier SA through a selection circuit SL1 or SL2, which is switch-controlled by a selection signal S1 and S2 corresponding to the odd/even number fields. Thereby, the sense amplifier SA is selectively used for two memory arrays.

Also not restricted particularly, for simplification of word line and data line selection circuits, the word line (row) selection signal for memory arrays M-ARY1 and M-ARY2 is formed by the (row) shift registers XSR1 and XSR2. The data line (column) selection signal is also formed by the (column) shift register YSR. The data line selection signal controls a switch circuit SW1 which connects the input/output node of the sense amplifier SA to the common data line for read operation. Thereby, information stored in the memory cell corresponding to a single word line is output serially to the common data line by the so-called column static operations.

The initial values of the shift registers XSR1, XSR2 and YSR are supplied from an address buffer ADB, described later, in order to make possible the serial input/output from a desired bit. Namely, a signal corresponding to logic "1" is input to the selected one bit of each shift register and logic "0" to the remaining bits. The word line or switch circuit SW1 is selected by shifting the logic "1" signal, namely the word line or data line selection signal, by the shift clock signal as will be explained later.

The address buffer ADB fetches respectively the row address signal AX and column address signal AY from an external terminal in synchronization with the first and second falling edge of an address strobe signal $\overline{AS}$. The address buffer ADB generates initial value ax of the shift registers XSR1, XSR2 based on the address signal AX, and supplies this signal to such registers. In the same way, the initial value ay of the shift register YSR is generated based on the address signal AY. The address buffer then supplies the ay signal to the YSR.

The address buffer ADB is controlled by the signals (not illustrated) generated in synchronization with the falling edge of the signal $\overline{AS}$ in a second timing generator TG2. Although not limited particularly, the initial value of the shift registers, namely the row and column address signals, are respectively supplied as parallel signals through the common external terminal and common address buffer in this embodiment.

The shift clock signal of the shift register YSR is supplied as the clock signal $\phi_y$ through the external terminal CLK. The clock signal $\phi_y$ defines one picture element and has the period, for example, of 70 ns. This clock signal $\phi_y$ shifts the data line selection signal being input to the shift registers YSR. As a result, the data lines are sequentially selected and stored information of selected memory cells are sequentially output to the common data line. The signal of this common data line is amplified by an output circuit OB and is sent serially to the external terminal (serial output terminal) $D_{out}$. The output circuit OB includes, although not limited particularly, a main amplifier and data output buffer. These circuits are formed by the well known static circuit.

The clock signals $\phi_x$ and $\phi_x'$ of the shift registers XSR1, XSR2 are formed on the basis of an output $\phi_{ct}$ of a counter circuit CT1. The counter circuit CT1 outputs the signal $\phi_{ct}$ during the period where 760 clock signals $\phi_y$, which is the period for reading the 760 memory cells corresponding to one word line, are input. In case the data line selection signal (logic "1") exists in the final bit of shift register YSR, the counter circuit CT1 detects such signal, stops output of the signal $\phi_{ct}$ and simultaneously restarts the contents of the counter. The first timing generator TG1 outputs the shift clock signal $\phi_x$ for shift register XSR1, based on the signal $\phi_{ct}$. This clock signal $\phi_x$ shifts the word line selection signal (logic "1") input to the shift register XSR1. Thereby, the word lines are sequentially selected from the left side of the memory array M-ARY1 in FIG. 1. In such a case when the logic "1" exists in the shift register XSR1 in the left side of the memory array, in other words, when the signal $\phi_{ct}$ generated is 250 or less, the signal $\phi_x$ is generated. The timing generator TG1 increments the signal $\phi_{ct}$. When the value of the TG1 is 251 or more, it generates the shift clock signal $\phi_x'$ for the shift register XSR2.

The signal $\phi_{ct}$ is supplied to the second counter circuit CT2. This second counter circuit CT2 increments on the signal $\phi_{ct}$ and outputs a selection signal S1 on a counted value of 250 or less. Thereby, the switch MOSFET which forms a selection circuit SL1 is set to the ON state and connects the memory array M-ARY1, including the selected word line, to the input/output node of the sense amplifier SA.

While, a counted value is 251 or more is present, a selection signal S2 is formed by the counter circuit CT2. Thereby, the data line of memory array M-ARY2 is coupled with the input/output node of sense amplifier SA.

In accordance with the signal $\phi_{ct}$, the timing generating circuit TG1 forms the operation timing signal $\phi_{pa}$ of sense amplifier SA, in synchronization with the timing signal $\phi_{ct}$. In other words, for each changeover of word line selecting operation, the sense amplifier SA is selected to the operating conditions for amplifying the information stored in the selected memory cell.

The sense amplifier SA may be set to a non-operative state immediately during a blanking period, but the selected state of word line is kept as it is for a certain period in order to acquire the write period described later. Before the next horizontal scanning period (during the blanking period), changeover of word line and amplifying operation period of sense amplifier SA is accomplished.

The timing generators TG1, TG2 generate a variety of internal signals which are necessary for operations of a semiconductor memory such as a control signal of output circuit OB and a control signal of input circuits IB1, IB2, described later, in addition to a control signal of address buffer ADB, based on the signals $\phi_{ct}$, AS, H, and DT.

The shift register WDFF and switch circuit SW2 are also provided in order to make possible the serial data input simultaneously with serial data output.

Moreover, in this embodiment, a mask circuit comprising the shift register MFF is provided in order to add a function for invalidating (masking) the input data (write signal) of the desired bits.

The clock signal $\phi_y$ is used as the clock signals of the shift registers WDFF and MFF.

The write signal is serially fetched from the external terminal $D_{in}$, through the input circuit IB1, to the shift register WDFF in synchronization with the clock signal $\phi_y$. Namely, the write signal is input serially in parallel with serial read by the shift operation of said shift register YSR. The input circuit IB1 comprises a static type data input buffer. In the next blanking period, the write data, as many as 760 dots corresponding to a single word line, are transferred in parallel to the data lines of memory array M-ARY1 or M-ARY2 by the switch circuit SW2. Thereby, the information stored in the selected memory cell is changed.

In this embodiment, a mask circuit MFF is provided for realizing the display function of a so-called "picture-in-a-picture," where another picture is displayed within one display picture. Namely, the signal $\overline{WE}$ which designates validity or invalidity of write signal is supplied, corresponding to said write signal to the shift register MFF in synchronization with the clock signal $\phi_y$ through the input circuit IB2. The input circuit IB2 is formed by a static type data input buffer. The output signal of each bit of shift register MFF corresponds to the write signal. For example, if such signal is a logic "0" (low level), the writing by the fetched write signal is invalidated. Namely, the unit switch circuit SW2 for writing is selectively set to an OFF state by the output signal of the shift register MFF. Thereby, writing of picture element data to be displayed is invalidated. For example, the memory area where the writing is invalidated is displayed as a space (black) by writing the picture element data which designates black thereto. The two pictures can therefore be displayed on a single screen by applying another picture signal. Moreover, said mask function can be utilized for eliminating noise which is undesirable for observation in fast speed playback in a video tape recorder, etc.

Figure 2:
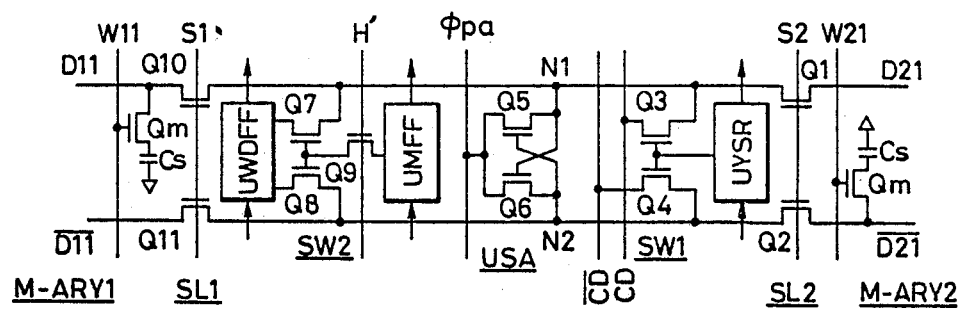
FIG. 2 is a practical circuit illustrating a part of a semiconductor memory of FIG. 1.

FIG. 2 illustrates a circuit diagram of a pair of complementary data lines in the memory arrays M-ARY1 and M-ARY2. Illustrated is one unit circuit which may be repeated in respective circuits.

A dynamic memory cell is comprised of a capacitor $C_s$ for storing information, and a MOSFET Qm for address selection. Said MOSFET Qm is set to the ON state by a high level (selection level) of the word line W11 coupled to the gate thereof, at which time said capacitor $C_s$ is coupled with the corresponding data line D11 (D21).

The complementary data lines D11, $\overline{D11}$ and D21, $\overline{D21}$ of the memory arrays M-ARY1 and M-ARY2 are connected to a pair of input/output nodes N1 and N2 of the unit sense amplifier USA through the switches MOSFETs Q10, Q11 and Q1, Q2 which form the selection circuits SL1 and SL2.

The unit sense amplifier USA comprises the differential amplifier MOSFETs Q5 and Q6 to which the gate and drain are cross-coupled. The USA is activated and makes the amplifying operation when the timing signal $\phi_{pa}$, for example of a low level, is applied to the common source line. The unit circuit of sense amplifier USA may also be formed by a pair of CMOS inverter circuits of which the input and outputs are cross-coupled. In this embodiment, the sense amplifier SA operates also as a latch circuit which holds data read from the memory cell.

The input/output nodes N1 and N2 are connected to the common complementary data lines CD, $\overline{CD}$ through the MOSFETs Q3 and Q4 which are switch-controlled by the output signal of the unit circuit UYRSR forming the shift register YSR. These common complementary data lines CD, $\overline{CD}$ are connected to the input terminal of the output circuit OB of FIG. 1. Therefore when the switch MOSFETs Q3 and Q4 are set to an ON state, the amplified output of the unit sense amplifier USA is transferred to the common complementary data lines CD, $\overline{CD}$ and thereby the serial output can be obtained as in the case of the column static operations.

The input/output nodes N1 and N2 are connected to a pair of output terminals of unit circuit UWDFF which forms a shift register WDFF for writing through the switch MOSFETs Q7 and Q8. An output signal of the unit circuit UMFF which forms the shift register MFF for mask is supplied to the gates of MOSFETs Q7 and Q8 through the switching MOSFET Q9. A write pulse H', generated with an adequate timing during the blanking period, is supplied to the gate of switch MOSFET Q9. For example, when an output signal of unit circuit UMFF for a mask operation is at a low level, the switch MOSFET Q7 and Q8 are set to an OFF state even when said write pulse H' is set to the high level. Therefore, the write signal fetched by the unit circuit UWDFF for writing is invalidated. When an output signal of the unit circuit UMFF for mask is at a high level, the switch MOSFETs Q7 and Q8 are set to an ON state when said write pulse H' is set to the high level. Therefore, the write signal fetched by the unit circuit UWDFF for writing is written in such a manner as it is transferred to the selected memory cell through the switch MOSFETs Q10 and Q11, or, Q1 and Q2.

The shift registers XSR1, XSR2, YSR, WDFF and MFF are formed by well known structure. Namely, the unit circuit (circuit for one bit) includes a master flip-flop circuit and a slave flip-flop circuit comprised of a pair of CMOS inverter circuits of which input and output are coupled each other. An N-channel MOSFET and a P-channel MOSFET as the transfer gate are alternately provided between such flip-flops, and said shift clock is supplied in common to their gate. A conductance of feedback inverter is set sufficiently smaller than that of the other inverter circuit. These shift registers may, for eaxmple, cause an output signal in synchronization with the high level of a shift clock. Moreover, the input terminal of the first bit of these shift registers is, although not limited particularly, connected to the ground potential through the transfer gate.

Figure 3:
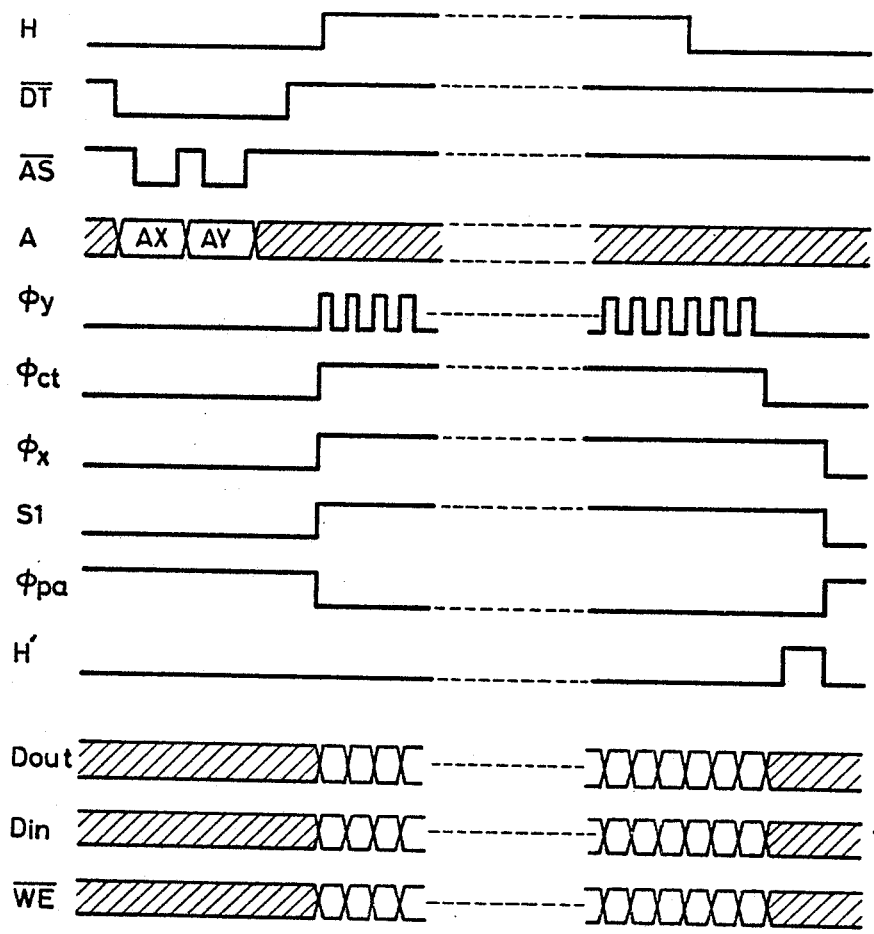
FIG. 3 is a timing diagram for explaining operations of semiconductor memory of FIG. 1.

Operation of a semiconductor memory of FIG. 1. is summarized with reference to the timing diagram of FIG. 3. During the horizontal blanking time of a CRT, namely while the signal H, of a low level, is applied to the timing generator TG2, data transfer and designation of address can be realized. First, the data transfer signal $\overline{DT}$ is set to the low level. The row and column address signals AX, AY are fetched in synchronization with the first and second falling edges of the address strobe signals $\overline{AS}$ while the signal DT is at a low level. Thereby, the initial values ax, ay of the shift registers XSR1, XSR2 and YSR are set.

During the horizontal scanning time of the CRT, namely during the high level of signal H, the clock signal $\phi_y$, synchronized with display of one picture element, is supplied. Accordingly, the signal $\phi_{ct}$ is generated on the basis of the signal $\phi_{ct}$.

When the signal $\phi_x$ is input to the shift register XSR1, a single word line W corresponding to the initial value is set to a high level. Meanwhile, when the signal S1 is set to a high level, the data lines D, $\overline{D}$ of memory array M-ARY1 are connected to the input/output nodes N1, N2 of the sense amplifier SA. The sense amplifier SA is made operative by the signal $\phi_{pa}$ of the low level, amplifying data of a memory cell and holding such data. Namely, the data of memory cells of a word line (760 cells) are read and held.

The shift registers YSR selects sequentially the unit switches of switch circuit SW1 in synchronization with the high level of clock signal $\phi_y$ and connects the data lines D, $\overline{D}$ to the common data line CD, $\overline{CD}$ Thereby, data of a word line are output serially from the external terminal $D_{out}$ in synchronization with the clock signal $\phi_y$ (actually, with a little delay).

Simultaneously with start of horizontal scanning, the clock signal $\phi_y$ is supplied and total 760 clock signals $\phi_y$ for a word line are supplied continuously. In synchronization with the end of period of 760 clock signals $\phi_y$, the signal $\phi_{ct}$ is set to a low level. In the timing with a little delay from low level of the signal $\phi_{ct}$, the signals $\phi_x$ and S1 are set to a low level and signal $\phi_{pa}$ to a high level for writing data as explained later.

In the case of forming a single display of the NTSC system with the signal of 757×250 (or 500), the last three signals among 760 signals of a word line are read during the blanking time. These three signals are invalidated, for example, by a digital/analog converter or picture signal processor which receives an output of the semiconductor memory.

In parallel with the read operation, a write operation is also carried out. In synchronization with the clock signal $\phi_y$, the write data is serially input to the shift register WDFF from the external terminal $D_{in}$ and the mask signal is input serially to the shift register MFF from the external terminal $\overline{WE}$ When input of 760 clock signals $\phi_y$ terminates, the write data is kept in the unit circuit UWDFF of a shift register corresponding to the memory cell to which data should be written. In the same way, the mask signal of write data is kept in the unit circuit of a mask circuit corresponding to the unit circuit UWDFF.

Although not particularly limited, in this embodiment, after the signal $\phi_{ct}$ becomes low, the timing generator TG1 or TG2 which has detected the signal of logic "1" of the final bit of the shift register YSR generates the write signal H'. Thereby, the shift register WDFF is connected to the data lines D, $\overline{D}$ through the switch circuit SW2 in accordance with the mask signal and data writing is carried out. For a constant period after the end of read operation, the signals $\phi_x$ and S1 are kept thereby at the high level and the signal $\phi_{pa}$ at the low level.

Since the horizontal blanking time is sufficiently long (in the order of a microsecond), the last three signals of a word line described above can be read and written.

In case the initial value of shift register YSR is set so that data read of a word line is started from an interim part, it is enough that supply of the clock signal $\phi_y$ is started from the intermediate part of horizontal scanning time in such a timing as to correspond to said initial value, or supply of the clock signal $\phi_y$ is started simultaneously with start of horizontal scanning time. In any case, as dummy clock signal $\phi_y$ is necessary for shifting the write and mask data to the predetermined bit of the shift register WDFF after the end of a read operation.

After the above-mentioned read and write operations are carried out, for example, 250 times, the signal S2 and $\phi_x'$ are generated in place of the signals S1 and $\phi_x$ and data of the memory array M-ARY2 is read in the same way. In case the initial value of shift regsiter XSR1 is set in order to select the word lines after the second line, it is detected that the signal of logic "1" is input to the final bit of the shift register XSR1. Thereby, the counted contents of the signals $\phi_{ct}$ and $\phi_x$ in the circuits CT2 and TG1 are reset and the signals S2 and $\phi_x'$ are generated.

Selection of the word line by the shift register XSR2 according to the initial value ax is synchronized with the leading edge of the signal $\phi_x'$.

Figure 4:
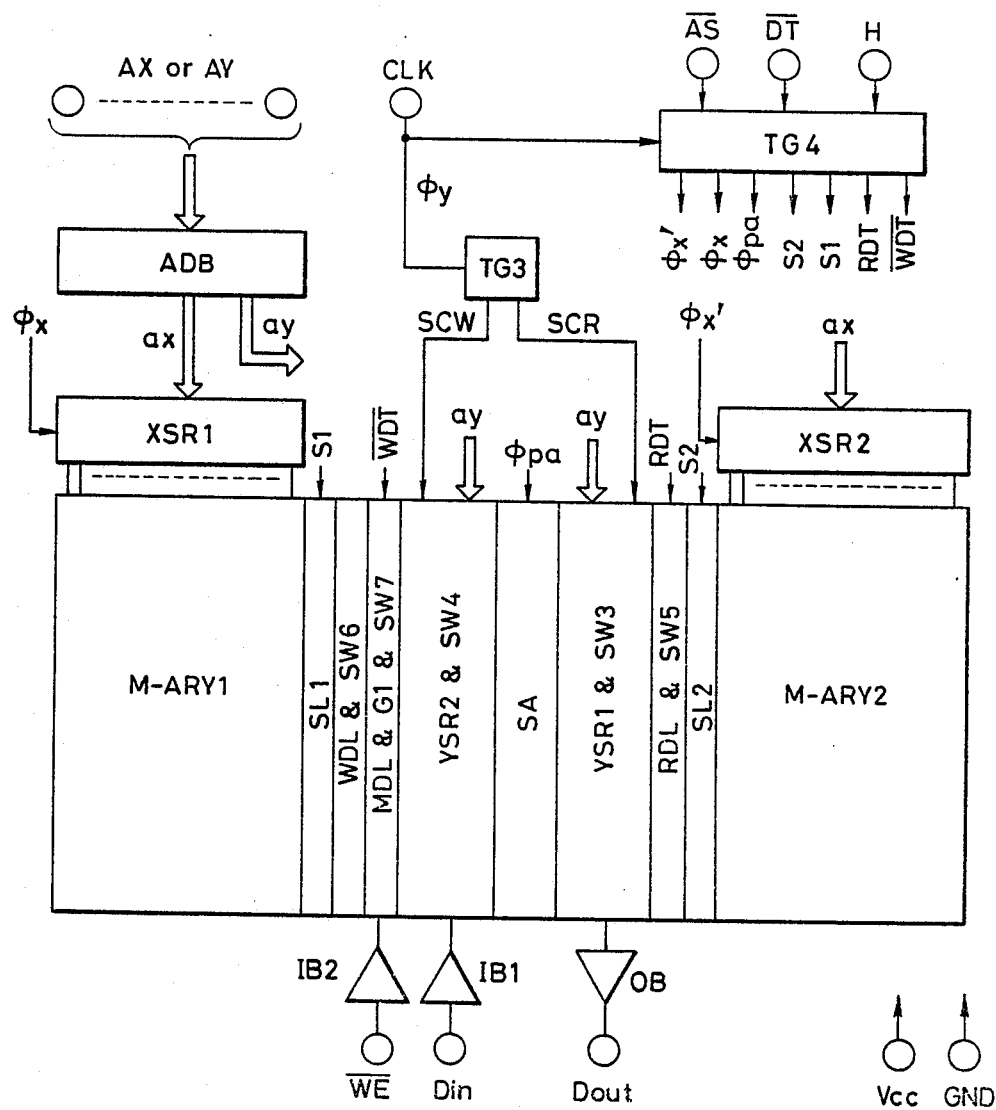
FIG. 4 is a block diagram of a semiconductor memory as another embodiment of the present invention.

FIG. 4 is a block diagram illustrating another embodiment of a semiconductor memory of the present invention. A semiconductor memory such as that of FIG. 4 is basically the same as the semiconductor of semiconductor memory of FIG. 1. Therefore, the structure of semiconductor memory of FIG. 4 is principally explained by focusing on difference between these semiconductor memories with reference to FIG. 4 and FIG. 5.

In this embodiment, data read from the memory array M-ARY is kept in the read data latch circuit RDL in place of the sense amplifier SA. A switch circuit SW5 is provided between the unit circuit URDL of read data latch circuit RDL and the data lines D, $\overline{D}$ The switch circuit SW5 is comprised of the N-channel MOSFETs Q15 and Q16 the gates of which receive a read data transfer signal RDT.

The switch circuit SW3 is provided between the unit circuit URDL and common (read) data lines CD, $\overline{CD}$ The switch circuit SW3 is comprised of the N-channel MOSFETs Q21, Q22, the gates of which gate receive an output signal of the shift register YSR1. The shift register YRSR1 and switch circuit SW3 operate in the same way as the shift register YSR and switch circuit SW1 shown in FIG. 1. Namely, the data kept in the latch circuit RDL is output serially to the external terminal $D_{out}$ through the output circuit OB. The shift clock of the shift register YSR1 is the clock signal SCR generated by the timing generator TG3 in almost the same timing as the clock signal $\phi_y$ based on such signal.

In this embodiment, the write data is kept and transferred without using the shift register WDFF. The write data is kept in the write data latch circuit WDL. The switch circuit SW6 is provided between the unit circuit UWDL of the write data latch circuit WDL and the data lines D, $\overline{D}$ The switch circuit SW6 is comprised of N-channel MOSFETs Q19 and Q20, the gates of which receive the mask signal described later.

The common (data) input lines ID, $\overline{ID}$ shift register YSR2, and switch circuit SW4, are further provided in order to correctly supply the data input in serial to the latch circuit WDL which is not provided with the function for shifting data.

The switch circuit SW4 is provided between the unit circuit UWDL and the common (data) input lines ID, $\overline{ID}$ The switch circuit SW4 is comprised of N-channel MOSFETs Q17 and Q18 the gates of which receive an output of the shift register YSR2. In this embodiment, as is apparent from FIG. 5, the write circuit has the structure similar to that of the data read circuit. The shift register YSR2 and switch circuit SW4 respectively operate in the same way as the shift register YSR1 and switch SW3. Namely, the data serially input to the external terminal $D_{in}$ is sequentially supplied to latch circuit WDL through the input circuit IB1 and common input lines ID, $\overline{ID}$ The shift clock of shift register YSR2 is the write shift clock signal SCW which is formed by the timing generator TG3 with an adequate delay from the signal SCR based on the clock signal $\phi_y$.

Although not limited particularly, the write data mask circuit may also be provided in this embodiment. The mask circuit comprises a mask data latch circuit MDL, a gate circuit G1 and a switch circuit SW7. The write data transfer signal $\overline{WDT}$ is not directly applied to the gates of MOSFETs Q19, Q20, and is instead supplied to the mask circuit. The mask data is kept and transferred without using the shift register MFF.

Corresponding to the data lines D, $\overline{D}$ the unit circuit of the mask circuit, namely a unit circuit UMDL of latch circuit MDL, is NOR gate circuit UG1 which is the unit circuit of gate circuit G1, and N-channel MOSFET Q23 which is the unit circuit of the switch circuit SW7. An output of the corresponding bit UYSR2 of shift register YSR2 is supplied to the gate of MOSFET Q23. Thereby, the mask data is fetched by the latch circuit UMDL corresponding to the latch circuit UWDL to which write data is written. The mask data of latch circuit UMDL is supplied to the one input of the NOR gate circuit UG1, while the signal $\overline{WDT}$ to the other input of the NOR gate circuit, respectively. When the mask data is at a high level, the MOSFETs Q19, Q20 remain in the OFF state, even during the write data transfer time (namely, the signal $\overline{WDT}$ is at a low level). Therefore, data of latch circuit UWDL is invalidated.

In this embodiment, since the sense amplifier SA does not keep the data which is read, operation timing becomes such as will be described below. Therefore, a variety of timing signals are generated on the basis of the signals $\phi_{ct}$, $\overline{AS}$ and $\overline{DT}$ in the timing generator TG4.

Figure 6:
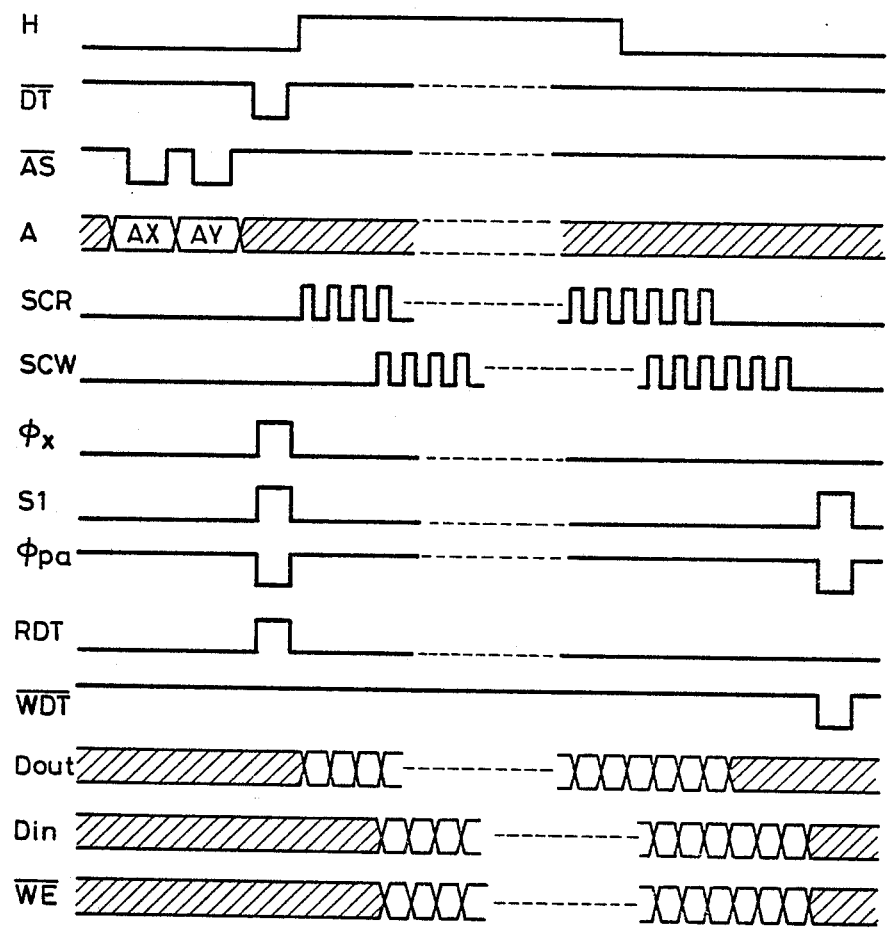
FIG. 6 is a timing diagram for explaining operations of semiconductor memory of FIG. 4.

Operations of a semiconductor memory of FIG. 4 are outlined with reference to the timing chart of FIG. 6.

The row and column address signals AX, AY are fetched in synchronization with the first and second falling edges of the address strobe signal $\overline{AS}$ during the horizontal blanking time of a CRT, namely during the low level of signal H. Thereby, the initial values ax, ay of the shift registers XSR1, XSR2 and YSR are set.

After input of the address signal, the data transfer signal $\overline{DT}$ is set to a low level in such time as to lead the timing where the signal H becomes a high level by the specified period. Thereby, the signals $\phi_x$, S1, $\phi_{pa}$ and RDT are generated.

A single word line W, corresponding to the initial value, is set to high level by input of the signal $\phi_x$ to the shift register XSR1. Meanwhile, when the signal S1 becomes high, the data lines D, $\overline{D}$ of memory array M-ARY1 are connected to the sense amplifier SA. The sense amplifier SA is operated by the signal $\phi_{pa}$, amplifying the data stored in the memory cell. Namely, data of memory cells comprising a word line (760 cells) are read. When the read data transfer signal RDT becomes high, the signal amplified by the sense amplifier SA is written into the latch circuit RDL through the switch circuit SW5. Data for a word line can thereby be held.

Since it is unnecessary that the sense amplifier keep the read data in this embodiment, after the data which is read is transferred, the signals $\phi_x$ and S1 are set to low level and signal $\phi_{pa}$ to a high level in synchronization with a low level of signal RDT. Accordingly, low power consumption can be realized by pulse operation of sense amplifier SA and influence of noise to the data line can be reduced. Moreover, after data which is read is transferred, data can be written in any desired timing.

During the horizontal blanking time of a CRT, namely during the signal H is high, the clock signal $\phi_y$ is supplied. When the clock signal SCR, which is generated almost in the same timing as said clock signal $\phi_y$, is supplied to the shift register YSR1 on the basis of such clock signal $\phi_y$, the data of latch circuit RDL is read serially to the external terminal $D_{out}$. The write operation is carried out in parallel with the read operation. In synchronization with SCW, generated based on the clock signal $\phi_y$, the write data is serially supplied to the common input lines ID, $\overline{ID}$ from the external terminal $D_{in}$, and the mask signal is also supplied to the switch circuit SW7 from the external terminal $\overline{WE}$ The write data and mask signal are respectively and sequentially input to the latch circuits WDL and MDL by the shift register YSR2. When 760 clock signals SCW are input, the write data are kept in the unit circuit UWDL of the latch circuit corresponding to the memory cells to which data must be written. In the same way, the mask signal of write data is kept in the unit circuit UMDL of the mask circuit corresponding to the unit circuit UWDL.

Although not limited particularly, the write data transfer signal $\overline{WDT}$ is generated, in this embodiment, by the timing generator TG4 which has detected the logic "1" of the final bit of shift register YSR2. Thereby, the latch circuit WDL is connected to the data lines D, $\overline{D}$ through the switch circuit SW6 in accordance with the mask signal. Therefore, the signals $\phi_{pa}$ and S1 are generated based on the signal WDT.

In this embodiment, since the shift clock of input of the serial data is delayed from that of output, the following becomes possible. Once operational processing has been executed for the data read to the terminal $D_{out}$, it can be supplied as the write data to the terminal $D_{in}$ during the same horizontal scanning period. It is also possible that delay of the shift clock SCW for the shift clock SCR is further increased, and the signal $\overline{WDT}$ is generated for data writing during the next horizontal scanning perod to that where the read operation has been conducted. In this case, the signal $\overline{WDT}$ can be generated by setting the signal $\overline{DT}$ to a low level while, for example, the signal H is in the high level.

The present invention provides the following effects:

(1) a semiconductor memory which functions as a memory for an apparatus, such as a television receiver, video tape recorder or video disk player, which assures serial input and output of data by the serial output operation where a column is changed in synchronization with a clock signal (or the clock signal based on it) corresponding to one picture element (one dot of a raster scan) of the horizontal scan line. The operation is one in which the write signal is supplied, in serial, in synchronization with said clock signal (or clock signal based on it) and thereafter such write signal is written in parallel can be obtained, (2) a picture memory which can be handled very easily can be achieved by forming a memory array selection signal and a variety of timing signals in synchronization with the clock signal, (3) the peripheral circuits of memory array can be simplified by utilizing an address selection circuit and shift registers for input and output of data and chip size can be reduced, and (4) the mask signal is supplied corresponding to the serial input of said write signal, the write signal is validated or invalidated and thereby different pictures can be displayed simultaneously in the desired area of a single display screen.

While the present invention has been particularly shown and described with reference to preferred embodiments thereof, it will be understood that changes in form and details may be made therein without departing from the spirit and scope of the invention.

A mask circuit for realizing the mask function may be omitted. It is of course possible that the memory cells are refreshed during the horizontal blanking time.

The row and column address can also be supplied in serial from the one external terminal. Moreover, the address signal input function may also be omitted. In this case, however, the start address is always set equal.

Different data from that from which data is read may be input to the memory cell.

It is also envisioned that the word line selection or data line selection may be realized by the address signal formed by the address counter circuit and the decoder circuit. In addition, the sense amplifier SA may be provided respectively for each memory array. Conversely, it is enough when only one memory array M-ARY is used.

Figure 5:
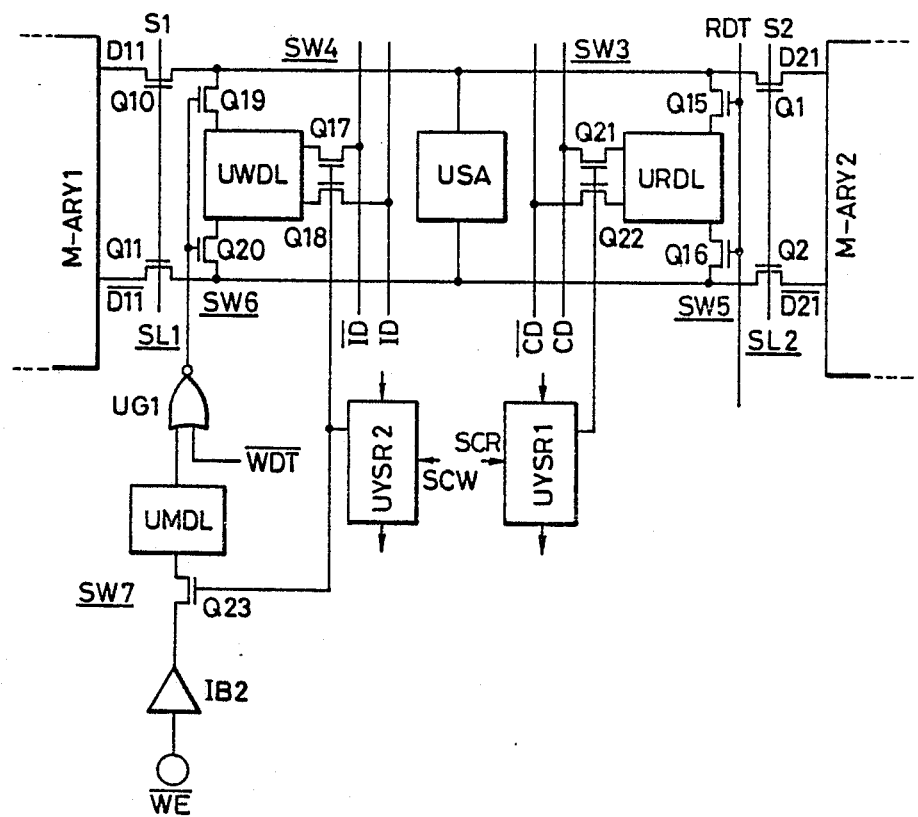
FIG. 5 is a practical circuit illustrating a part of a semiconductor memory as another embodiment of the present invention.

The memory array permits employment of various kinds of structures. For example, four memory arrays including 250 word lines and 190 data lines are provided in order to store the data which forms one display picture. In this case, data of one horizontal scanning line is read as 190 data units from different memory arrays. Moreover, four memory arrays are sorted into two groups and structure shown in FIG. 5 is adopted to one group (two) of memory arrays. The recommended readout of data is carried out sequentially from the memory arrays; first memory array of the first group, first memory array of the second group, second memory array of the first group and second memory array of the second group. With regard to the write operation, for example, during a readout operation from the first memory array of the second group, data can be written into the first memory array of the first group. During the same horizontal scanning period as the readout operation, different from the horizontal blanking time, the data which has been processed may also be written again. Moreover, it is also allowed that a display picture is divided into several sections and foregoing processing may be done for each 64 and 32 cells in place of 190 cells.

The present invention is very effective for memory to be widely used in various apparatuses such as television receivers, video tape recorders, or video disk players, which display pictures using a CRT, a printer, disk memory, etc., which serially inputs or outputs data.

What is claimed is:

1. A semiconductor memory comprising:
   a memory array which includes word lines, a set of data lines crossing thereto, and memory cells, arranged corresponding to intersecting points of said word lines and said data lines,
   a first selection circuit for selecting said word lines,
   a selection means including designating means for designating one of said data lines in accordance with an address signal, and a second selection circuit coupled to said designating means and to a timing signal means, for connecting a predetermined data line for said data lines to a common data line in synchronization with a first clock signal provided from said timing signal means after connecting said one data line to said common data line;
   an output circuit for serially outputting a signal of said common data line to a first external terminal,
   a means for holding signals serially supplied to a second external terminal in synchronization with a second clock signal, and
   a means for selectively writing in parallel the signals of said holding means to said memory cells through said data lines.

2. A semiconductor memory as defined in claim 1, further including means for generating each of said first and second clock signals based on an external clock signal.

3. A semiconductor memory as defined in claim 2, wherein the means for generating the clock signals including means for generating said second clock signal with a delay from said first clock signal.

4. A semiconductor memory as defined in claim 2, wherein said first selection circuit includes means for selecting said word lines in synchronization with a third clock signal generated by counting said first clock signal.

5. A semiconductor memory as defined in claim 2, further comprising a means for detecting said data lines to be connected by said second selection circuit, wherein said first selection circuit selects said word lines in synchronization with a third clock signal generated in response to said detecting means.

6. A semiconductor memory as defined in claim 2, wherein said first and second selection circuits are comprised of shift registers.

7. A semiconductor memory as defined in claim 2, wherein said first selection circuit has a means for selecting said word lines in accordance with external address signals.

8. A semiconductor memory as defined in claim 2, further comprising a means for detecting when no said data lines are to be connected by said second selection circuit, wherein said parallel writing is carried out to said memory cells by a write signal generated in response to said detecting means.

9. A semiconductor memory as defined in claim 1, wherein said holding means is a shift register.

10. A semiconductor memory as defined in claim 1, wherein said holding means comprises a latch circuit holding the signals, a common input line connected to said second external terminal and a shift register for selectively writing the signals of said common input line to said latch circuit, which is operated in synchronization with said second clock signal.

11. A semiconductor memory as defined in claim 10, further comprising a means for generating said second clock signal by a delay from said first clock signal wherein each of said first and second clock signals is formed based on an external clock signal.

12. A semiconductor memory as defined in claim 1, wherein said memory array is divided into a plurality of different memory arrays and signals of said different memory arrays are output serially from said output circuit.

13. A semiconductor memory as defined in claim 12, further comprising a means for detecting when no said word lines are to be selected by said first selection circuit, wherein signal outputs of said different memory arrays are changed over in response to said detecting means.

14. A semiconductor memory as defined in claim 12, further comprising a means for detecting when no said data lines are to be connected by said second selection circuit, wherein signal outputs of said different memory arrays are changed over in response to said detecting means.

15. A semiconductor memory comprising:
   a memory array which includes word lines, data lines crossing thereto, and memory cells, arranged corresponding to intersecting points of said word lines and said data lines,
   a first selection circuit for selecting said word lines,
   a second selection circuit for connecting said data lines selectively to a common data line in synchronization with a first clock signal, an output circuit for serially outputting a signal of said common data line to a first external terminal, a means for holding signals serially supplied to a second external terminal in synchronization with a second clock signal, a means for writing in parallel the signals of said holding means to said memory cells through said data lines, a switch circuit provided between said holding means and said data lines, and a means for invalidating the signal of said holding means by controlling said switch circuit.

16. A semiconductor memory as defined in claim 15, wherein said invalidating means is comprised of a shift register which fetches mask signals for designating invalidation of signal of said holding means.

17. A semiconductor memory as defined in claim 15, wherein said invalidating means is comprised of a latch circuit which holds mask signals for designating invalidation of signals of said holding means.

18. A semiconductor memory as defined in claim 17, wherein said holding means is comprised of a latch circuit for holding signals, a common input line connected to said second external terminal, and a shift register which selectively writes the signals of said common input to said latch circuit, said shift register is operated in synchronization with said second clock signal, and the mask signals is selectively fetched to said mask signal latch circuit by said shift register.

19. A semiconductor memory as defined in claim 1, further comprising a sense amplifier for amplifying the signals given to said data lines from said memory cells and latch circuit for holding said amplified signals.

20. A semiconductor memory as defined in claim 19, wherein said sense amplifier is used as said latch circuit.

21. A semiconductor memory as defined in claim 19, wherein said sense amplifier is not operated during said serial output after said amplifier signals are latched.

22. A semiconductor memory as defined in claim 19, wherein said data lines are separated from said sense amplifier and latch circuit after said amplified signals are latched.

23. A semiconductor memory comprising:
a memory array which includes word lines, data lines which cross thereto, and memory cells arranged, at the intersecting points of said word lines and data lines, a means for reading in parallel readout data from said memory cells connected to a selected one of said word lines, a means for storing said readout data which is read, a means for outputting in serial said readout data stored in said storing means to a first external terminal in synchronization with a first clock signal, a means for selectively holding serial write data being serially input from a second external terminal in synchronization with a second clock signal, and a means for writing in parallel held write data to the memory cells connected to the selected one word line.

24. A semiconductor memory as defined in claim 23, further comprising, a means for invalidating said held write data.

25. A semiconductor memory as defined in claim 23, further comprising a means for generating said first and second clock signals in synchronization with an external clock signal supplied from a third external terminal, wherein said second clock signal is generated with a slight delay from said first clock signal.

26. A semiconductor memory as defined in claim 23, further comprising a designating means for designating read out data to be output at first in said read out data stored in said storing means in said serial outputs in accordance with an address signal.

27. A semiconductor memory as defined in claim 23, wherein said serial write data are input during an output period of said serial readout data.

28. A semiconductor memory as defined in claim 23, wherein said write data are written in parallel to the memory cells during a period of serial output of said readout data.

* * * * *